(12) United States Patent
Suzuki

(10) Patent No.: US 11,711,909 B2
(45) Date of Patent: *Jul. 25, 2023

(54) ELECTRONIC DEVICE

(71) Applicant: KIOXIA CORPORATION, Tokyo (JP)

(72) Inventor: Akitoshi Suzuki, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 15 days.

This patent is subject to a terminal disclaimer.

(21) Appl. No.: 17/398,725

(22) Filed: Aug. 10, 2021

(65) Prior Publication Data
US 2021/0378145 A1 Dec. 2, 2021

Related U.S. Application Data

(63) Continuation of application No. 16/656,427, filed on Oct. 17, 2019, now Pat. No. 11,122,709, which is a
(Continued)

(30) Foreign Application Priority Data

Mar. 16, 2017 (JP) .................. 2017-050896

(51) Int. Cl.
*H05K 7/20* (2006.01)
*H05K 5/00* (2006.01)
(Continued)

(52) U.S. Cl.
CPC ....... *H05K 7/20436* (2013.01); *H05K 1/0203* (2013.01); *H05K 5/006* (2013.01); *H05K 5/0008* (2013.01); *H05K 7/20136* (2013.01); *H05K 7/20472* (2013.01); *H05K 1/144* (2013.01); *H05K 1/181* (2013.01);
(Continued)

(58) Field of Classification Search
CPC ............... H05K 1/144; H05K 7/20145; H05K 7/20436; H05K 7/20409; H01L 23/3675
See application file for complete search history.

(56) References Cited

U.S. PATENT DOCUMENTS 6,269,537 B1 8/2001 Kimura et al.
7,606,027 B2 10/2009 Takasou
(Continued)

FOREIGN PATENT DOCUMENTS

JP 2001-094283 A 4/2001
JP 4735528 B2 7/2011
JP 5295043 B2 9/2013

*Primary Examiner* — Mukundbhai G Patel
(74) *Attorney, Agent, or Firm* — Kim & Stewart LLP

(57) ABSTRACT

An electronic device includes a top plate having a first surface and a second surface that is positioned at an elevation that is lower than an elevation of the first surface, the second surface extending from a first end part of the top plate to a second end part of the top plate, a bottom plate provided under the top plate, and a circuit board placed between the top plate and the bottom plate and mounted with an electronic component. The top plate has opposing first and second edges and opposing third and fourth edges that are perpendicular to the first and the second edges, the first end part being formed at the first edge and the second end part being formed at the second edge.

11 Claims, 9 Drawing Sheets

Related U.S. Application Data continuation of application No. 15/903,584, filed on Feb. 23, 2018, now Pat. No. 10,524,390.

(51) Int. Cl.
*H05K 1/02* (2006.01)
*H05K 1/18* (2006.01)
*H05K 1/14* (2006.01)

(52) U.S. Cl.
CPC ............... *H05K 2201/042* (2013.01); *H05K 2201/10015* (2013.01); *H05K 2201/10159* (2013.01); *H05K 2201/10189* (2013.01); *H05K 2201/10409* (2013.01); *H05K 2201/10424* (2013.01); *H05K 2201/10522* (2013.01)

(56) References Cited

U.S. PATENT DOCUMENTS

| | | |
|---|---|---|
| 8,665,601 B1 | 3/2014 | Mangay-Ayam, Jr. et al. |
| 2002/0112869 A1 | 8/2002 | Kobayashi et al. |
| 2003/0034148 A1 | 2/2003 | Oyamada |
| 2008/0266806 A1 | 10/2008 | Lakin et al. |
| 2015/0331460 A1* | 11/2015 | Mataya ................ H05K 1/0206 361/679.31 |
| 2016/0270261 A1* | 9/2016 | Matsuda ............ G11B 33/1406 |
| 2017/0038802 A1 | 2/2017 | Kwon et al. |
| 2017/0290173 A1 | 10/2017 | Shoji et al. |

\* cited by examiner

ELECTRONIC DEVICE

CROSS-REFERENCE TO RELATED APPLICATIONS

This application is a continuation of U.S. patent application Ser. No. 16/656,427, filed Oct. 17, 2019, which this application is a continuation of U.S. patent application Ser. No. 15/903,584, filed Feb. 23, 2018, now U.S. Pat. No. 10,524,390, issued Dec. 31, 2019, which this application is based upon and claims the benefit of priority from Japanese Patent Application No. 2017-050896, filed Mar. 16, 2017, the entire contents of which are incorporated herein by reference.

FIELD

Embodiments described herein relate generally to an electronic device.

BACKGROUND

Some electronic devices utilize airflows for heat dissipation. In such devices, blocking the airflows may result in insufficient heat dissipation.

DETAILED DESCRIPTION

Embodiments provide an electronic device with improved heat dissipating characteristics.

In general, according to one embodiment, an electronic device includes a top plate, a bottom plate, and a circuit board. The top plate has a first surface and a second surface that is positioned at an elevation that is lower than an elevation of the first surface, the second surface extending from a first end part of the top plate to a second end part of the top plate. The bottom plate is provided under the top plate. The circuit board is placed between the top plate and the bottom plate and is mounted with an electronic component. The top plate has opposing first and second edges and opposing third and fourth edges that are perpendicular to the first and the second edges, the first end part being formed at the first edge and the second end part being formed at the second edge.

Hereinafter, electronic devices relating to embodiments of the present disclosure will be described in detail with reference to the attached drawings. It is noted that these exemplary embodiments are not intended to limit the scope of the present disclosure.

First Embodiment

Figure 1A:
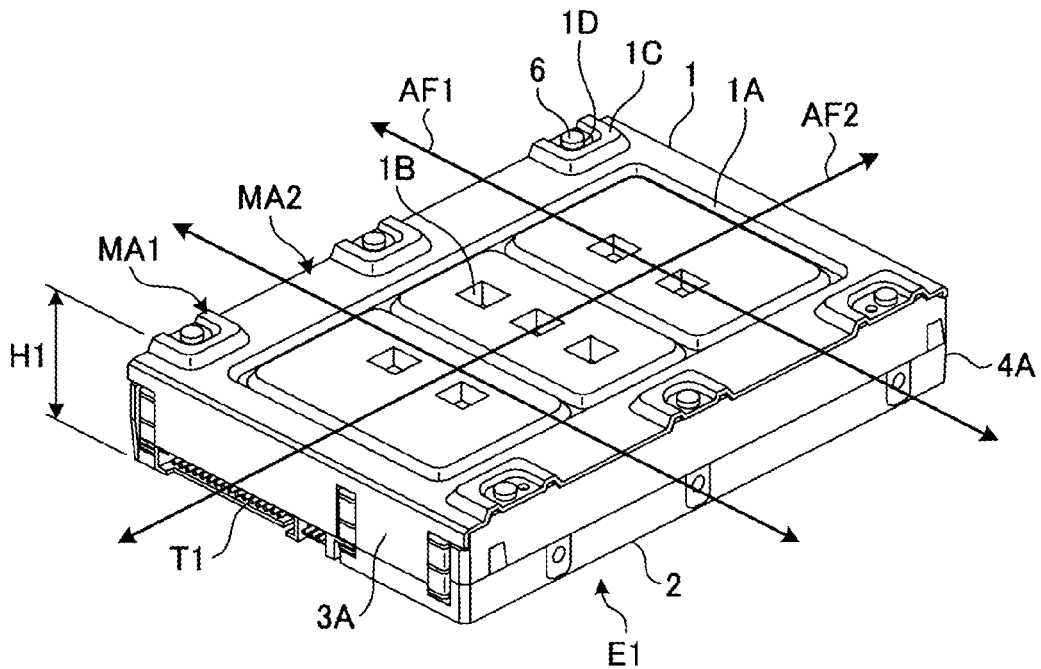
FIG. 1A is a perspective view showing a schematic structure of an electronic device relating to a first embodiment as seen from a side of a top plate.
Figure 1B:
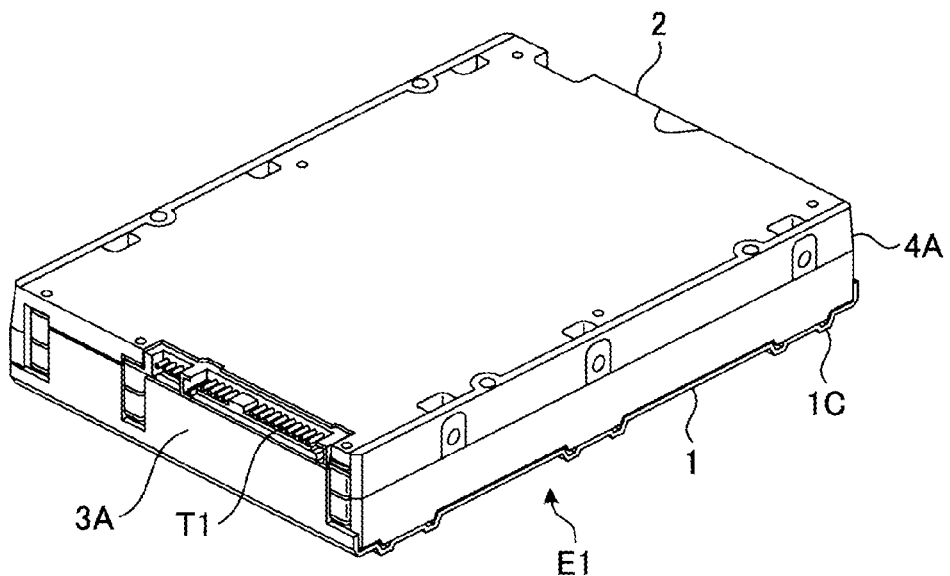
FIG. 1B is a perspective view showing a schematic structure of the electronic device relating to the first embodiment as seen from a side of a bottom plate.
Figure 2:
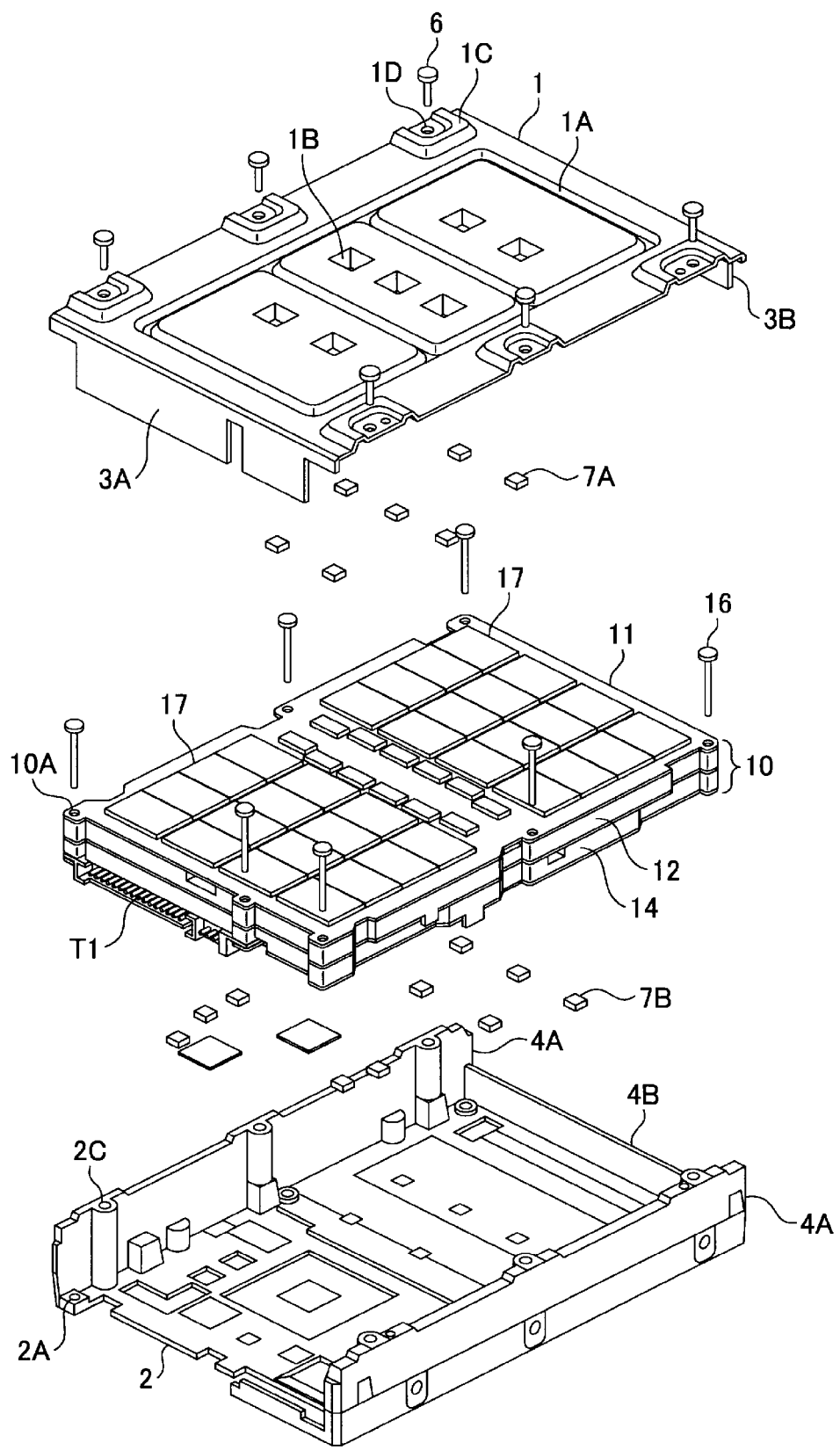
FIG. 2 is an exploded perspective view of the electronic device shown in FIG. 1A.
Figure 3:
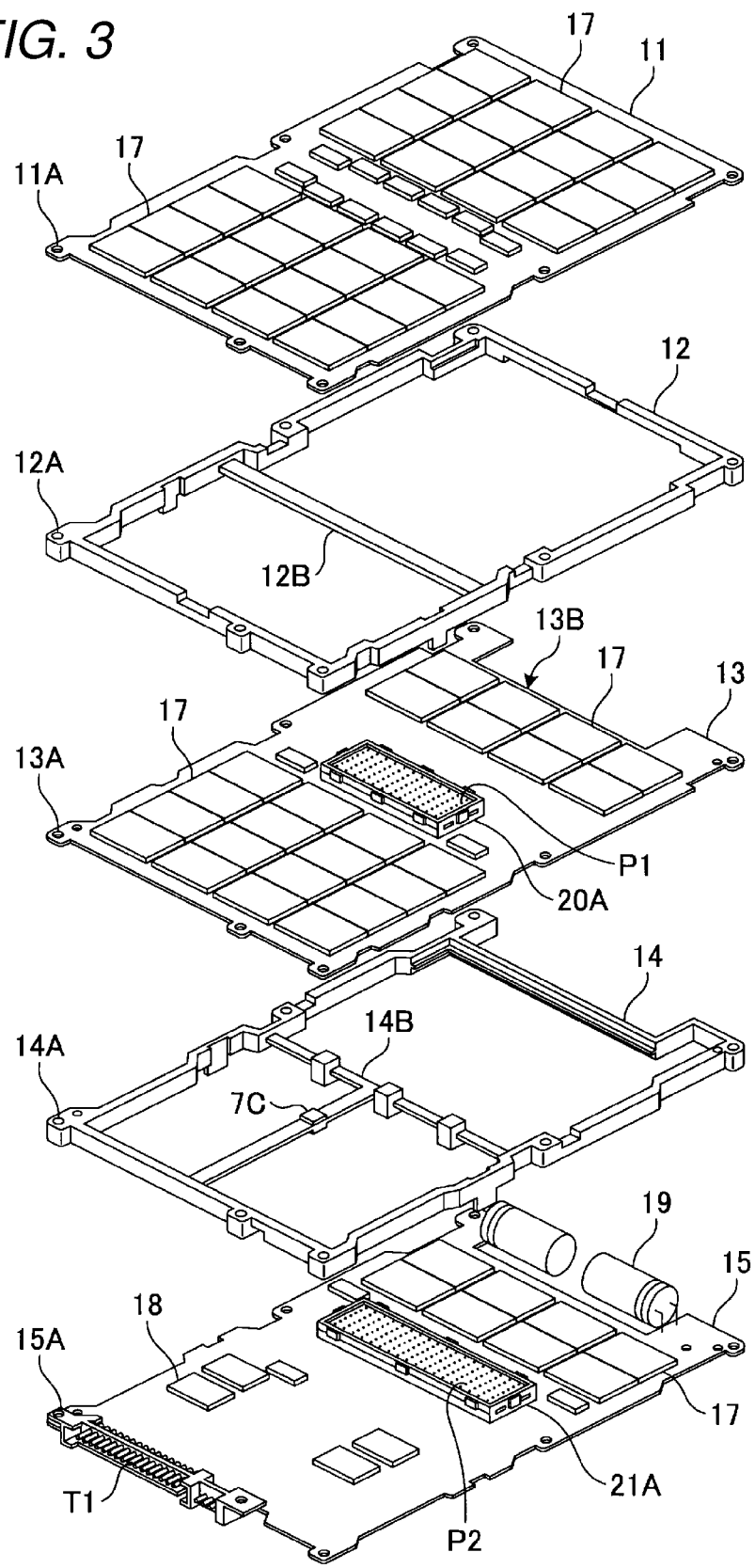
FIG. 3 is an exploded perspective view of a board assembly shown in FIG. 2.
Figure 4:
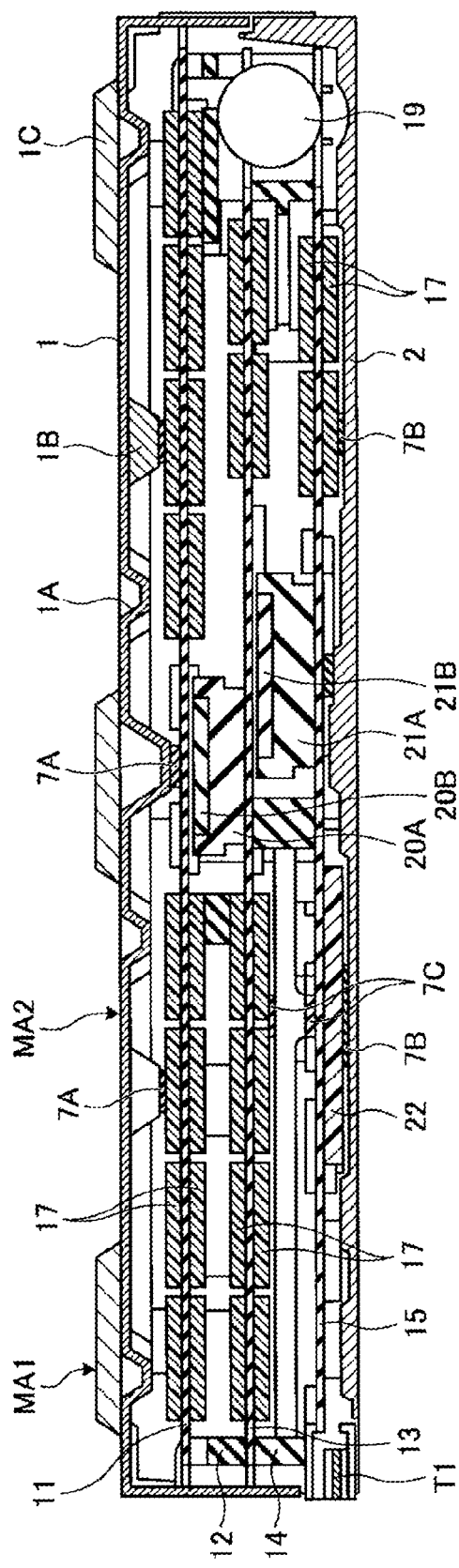
FIG. 4 is a sectional view showing a schematic structure of the electronic device relating to the first embodiment.

FIG. 1A is a perspective view showing a schematic structure of an electronic device relating to a first embodiment as seen from a side of a top plate, and FIG. 1B is a perspective view showing a schematic structure of the electronic device relating to the first embodiment as seen from a side of a bottom plate. FIG. 2 is an exploded perspective view of the electronic device shown in FIG. 1A. FIG. 3 is an exploded perspective view of a board assembly shown in FIG. 2. FIG. 4 is a sectional view showing a schematic structure of the electronic device relating to the first embodiment.

The following description exemplifies a solid state drive (SSD) as an electronic device in each embodiment. Although an electronic device having three circuit boards is described in each embodiment, the electronic device may have an "N" (where N is a positive integer) number of circuit boards.

FIGS. 1A and 1B show an electronic device E1 having a top plate 1 and a bottom plate 2. The top plate 1 may have opposing first and second sides and opposing third and fourth sides that are perpendicular to the first and the second sides. Hereinafter, the first and the second sides of the top plate 1 correspond to front and back ends of the top plate 1, and the third and the fourth sides of the top plate 1 correspond to left and right ends of the top plate 1. As shown in FIG. 2, a board assembly 10 is placed between the top plate 1 and the bottom plate 2. The board assembly 10 is formed with through holes 10A. The board assembly 10 includes circuit boards 11, 13, and 15, as shown in FIG. 3.

As shown in FIGS. 1A, 1B, and 2, side plates 3A and 3B are respectively provided at the front and back ends of the top plate 1. Side plates 4A are respectively provided at left and right ends of the bottom plate 2, and a side plate 4B is provided at a back end of the bottom plate 2. The top plate 1, the bottom plate 2, the side plates 3A, 3B, 4A, and 4B may enclose the board assembly 10.

The top plate 1 also has protrusions 1C. The protrusions 1C may be provided at an outer edge part of the top plate 1. Although the protrusions 1C are formed at six points of the outer edge part of the top plate 1 in FIGS. 1A and 2, the protrusions 1C may be formed at at least two points of the outer edge part of the top plate 1. Each of the protrusions 1C is formed with a through hole 1D. The through hole 1D is made to pass through a screw 6. The top plate 1 also has a rib 1A and recesses 1B. The rib 1A increases the rigidity of the top plate 1. The rib 1A may be formed so as to protrude from the top plate 1 toward the bottom plate 2. The recesses 1B serve as paths for dissipating heat generated from the board assembly 10.

Each of the protrusions 1C is formed with a first surface MA1. The top plate 1 is formed with a second surface MA2. The second surface MA2 is positioned at an elevation that is lower than an elevation of the first surfaces MA1 as seen from the side of the top plate 1. The second surface MA2 may include surfaces of the rib 1A and the recesses 1B. The electronic device E1 has a height H1 that is determined by a vertical distance from a bottom surface of the bottom plate 2 to the first surface MA1 of the protrusion 1C. The height H1 of the electronic device E1 may conform to the Small Form Factor (SFF) standard.

Airflows AF1 and AF2 can pass through among the protrusions 1C over the second surface MA2 of the top plate 1. The airflows AF1 and AF2 can pass through in directions different from each other. For example, the airflows AF1 mainly pass through in the left and right direction of the top plate 1, and the airflow AF2 mainly passes through in the front and back direction of the top plate 1.

As shown in FIG. 2, the bottom plate 2 is formed with screw holes 2A and 2C. The screw holes 2A each are made to receive a screw 16. The screw holes 2C each are made to receive the screw 6. The screw 16 is inserted through the through hole 10A into the screw hole 2A to fix the board assembly 10 to the bottom plate 2. The screw 6 is inserted through the through hole 1D into the screw hole 2C to fix the top plate 1 to the bottom plate 2.

Heat dissipating sheets 7A may be interposed between the top plate 1 and the surface of the board assembly 10. Heat dissipating sheets 7B may be interposed between the bottom plate 2 and a back surface of the board assembly 10. In a condition in which the top plate 1 and the board assembly 10 are fixed to the bottom plate 2 with the screws 6, the heat dissipating sheets 7A contact the top plate 1 and the surface of the board assembly 10, and the heat dissipating sheets 7B contact the bottom plate 2 and the back surface of the board assembly 10. Each of the heat dissipating sheets 7A and 7B is preferably made of a heat-conductive elastic material, and for example, an acrylic resin may be used.

As shown in FIGS. 3 and 4, NAND packages 17 are mounted on each of the circuit boards 11, 13, and 15. The NAND packages 17 seal semiconductor chips, which are NAND flash memories (hereinafter referred to as "NAND memories"). The NAND packages 17 may be mounted on both sides of each of the respective circuit boards 11, 13, and 15.

A connector 20B is mounted on a back surface of the circuit board 11. A connector 20A is mounted on a surface of the circuit board 13. The connector 20A is formed with pin holes P1. A connector 21B is mounted on a back surface of the circuit board 13. The circuit board 13 may be formed with a cutout 13B at a position corresponding to the positions of capacitors 19. A connector 21A, dynamic random access memory (DRAM) packages 18, and the capacitors 19 are mounted on a surface of the circuit board 15. The capacitors 19 supply electric power to enable movement of data stored in a dynamic random access memory (DRAM) to the NAND memory in case an external power source to the electronic device E1 is cut off. The connector 21A is formed with pin holes P2. The DRAM packages 18 seal semiconductor chips, which are DRAMs.

A controller package 22 is mounted on a back surface of the circuit board 15. A connector T1 is mounted on an end of the circuit board 15. The controller package 22 seals a semiconductor chip, which is a controller. The controller operates as an interface for exchanging read data and write data between a host and the NAND memory. For example, the controller buffers read data and write data and performs error correction code (ECC) processing, wear leveling processing, randomizing processing, and other processing. The wear leveling processing is conducted to avoid concentration of writing of data to a specific block in the NAND memory. The randomizing processing is conducted to make data that are written in the same block in the NAND memory to not have periodicity, thereby preventing inter-cell interference.

Each of the NAND packages 17, the DRAM packages 18, and the controller package 22 may be a quad flat package (QFP), a ball grid array (BGA) package, a chip on board (COB) package, or a chip size package (CSP). The types of the NAND packages 17, the DRAM packages 18, and the controller package 22 may differ from each other. For example, the NAND packages 17 and the DRAM packages 18 may be QFPs, and the controller package 22 may be a COB package.

The board assembly 10 includes frame members 12 and 14. The frame member 12 is formed with a reinforcing part 12B. The frame member 14 is formed with a reinforcing part 14B.

The circuit boards 11, 13, and 15 and the frame members 12 and 14 are respectively formed with through holes 11A, 13A, 15A, 12A, and 14A. The through holes 11A, 13A, 15A, 12A, and 14A constitute the through holes 10A of the board assembly 10. The through holes 11A, 13A, 15A, 12A, and 14A each are made to pass through the screw 16. The through holes 11A, 13A, 15A, 12A, and 14A may be provided at four corners of the respective circuit boards 11, 13, 15 and the frame members 12 and 14.

The frame member 12 is interposed between the circuit boards 11 and 13. The frame member 14 is interposed between the circuit boards 13 and 15. Pins of the connector 20B are inserted into the pin holes P1 of the connector 20A, and pins of the connector 21B are inserted into the pin holes P2 of the connector 21A, whereby the board assembly 10 is assembled. The frame member 12 maintains a constant space between the circuit boards 11 and 13. The frame member 14 maintains a constant space between the circuit boards 13 and 15.

As shown in FIG. 4, heat dissipating sheets 7C may be placed between the circuit boards 13 and 15. The heat dissipating sheets 7C may be placed at positions corresponding to the position of the controller package 22. The heat dissipating sheets 7B may be placed at positions corresponding to the position of the controller package 22 and the positions of the NAND packages 17 on the back surface of the circuit board 15. Moreover, the heat dissipating sheets 7B may also be placed on exothermic components on the back surface of the circuit board 15. The heat dissipating sheets 7A may be placed at positions corresponding to the positions of the recesses 1B and the positions of the NAND packages 17 on the surface of the circuit board 11.

Arranging the heat dissipating sheets 7B and 7C at the positions corresponding to the controller package 22 enables heat that is generated by the controller package 22 to be dissipated efficiently in a vertical direction of the controller package 22.

Arranging the heat dissipating sheets 7A at the positions corresponding to the recesses 1B enables heat that is generated from the board assembly 10 to be dissipated efficiently to the top plate 1. The heat that is transmitted from the board assembly 10 to the top plate 1 is dissipated to the outside of the electronic device E1 by the airflows AF1 and AF2.

The second surface MA2 of the top plate 1 is positioned lower than the first surfaces MA1. This structure allows the airflows AF1 and AF2 to pass through over the second surface MA2 of the top plate 1 without changing the height H1 of the electronic device E1. Thus, the heat dissipating characteristic of the electronic device E1 conforming to the SFF standard is improved, and therefore, the reliability of the electronic device E1 is improved as well as equipment for assembling the electronic device E1 and a package of the electronic device E1 are made common with other devices that conform to the SFF standard.

Figure 5:
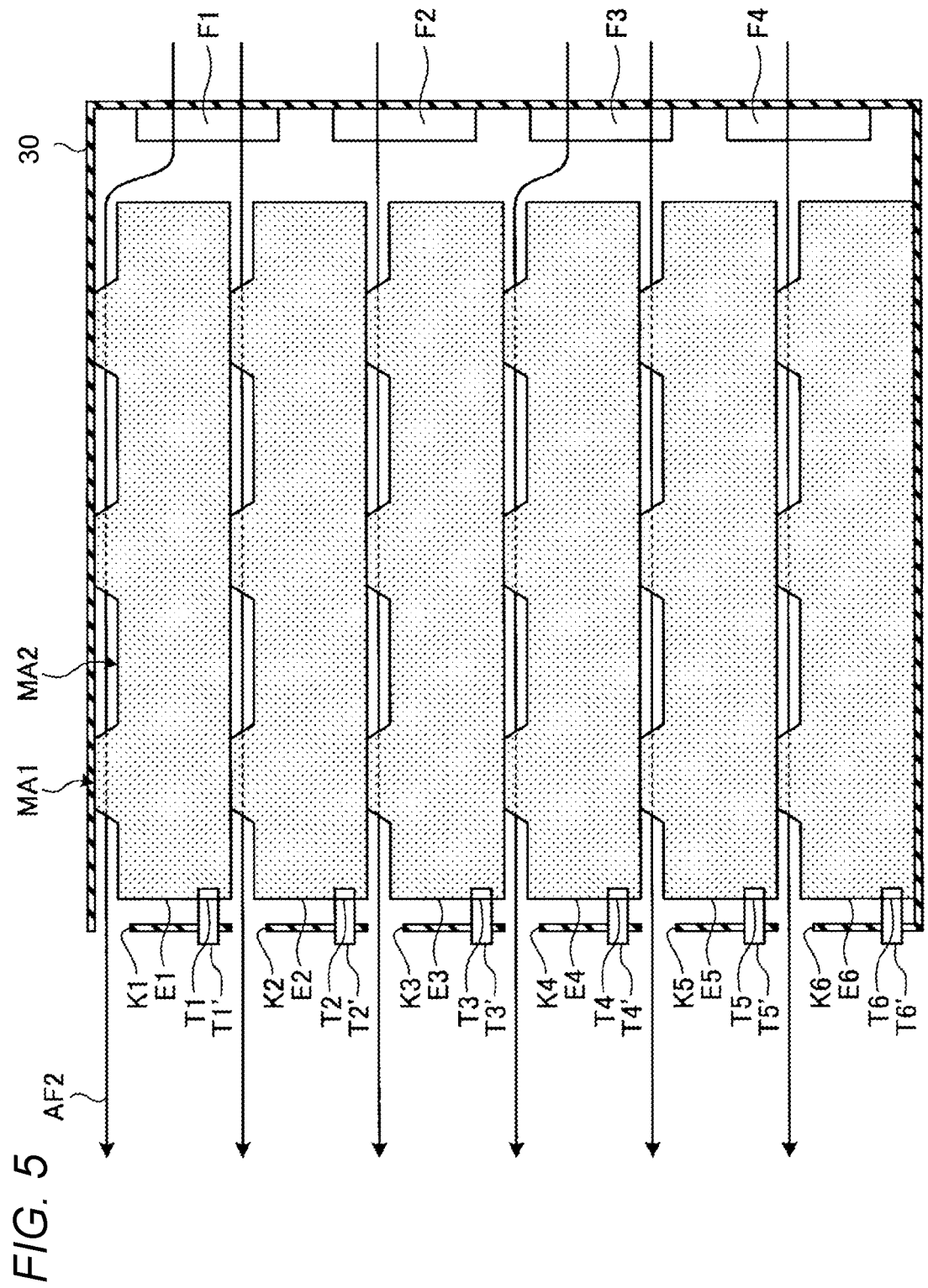
FIG. 5 is a sectional view for showing an airflow condition when multiple electronic devices in FIG. 1A are stacked in a rack.

FIG. 5 is a sectional view for showing an airflow condition when multiple electronic devices in FIG. 1A are stacked in a rack.

FIG. 5 shows a rack 30 that is provided with ventilating holes K1 to K6, connectors T1' to T6', and fans F1 to F4. The rack 30 contains stacked electronic devices E1 to E6. The electronic devices E1 to E6 may have the same structure as the electronic device shown in FIG. 1A. In this condition, for example, a first surface MA1 of a lower stage electronic device E2 contacts a bottom surface of an upper stage electronic device E1 with a space between a second surface MA2 of the lower stage electronic device E2 and the bottom surface of the upper stage electronic device E1. This space is used as a ventilating path inside the rack 30. The electronic devices E1 to E6 respectively have connectors T1 to T6, which are connectable to the corresponding connectors T1' to T6' of the rack 30.

While the electronic devices E1 to E6 are powered on, the fans F1 to F4 are operated. Then, airflows AF2 are generated inside the rack 30. The airflows AF2 pass through between each of the electronic devices E1 to E6 and flow out from the respective ventilating holes K1 to K6.

At this time, the airflows AF2 cool the electronic devices E1 to E6. Ventilation resistance against the airflows AF2 flowing inside the rack 30 is reduced, whereby the temperature inside the rack 30 is efficiently decreased. The height H1 of each of the electronic devices E1 to E6 may conform to the SFF standard. Thus, the electronic devices E1 to E6 are contained in the rack 30 without changing the size of the rack 30 that is suitable for the SFF standard.

Second Embodiment

Figure 6:
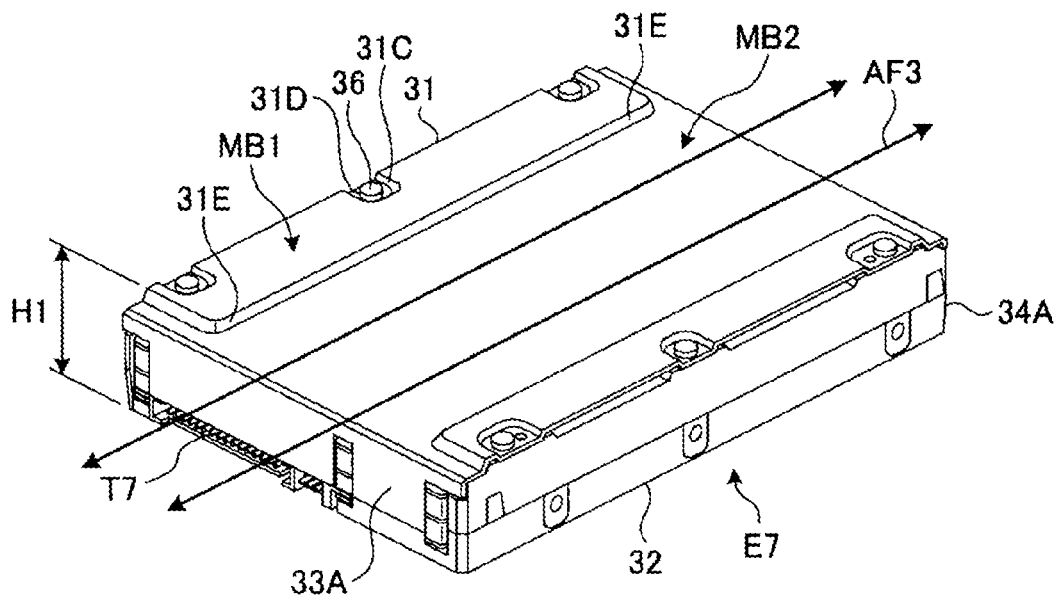
FIG. 6 is a perspective view showing a schematic structure of an electronic device relating to a second embodiment as seen from a side of a top plate.

FIG. 6 is a perspective view showing a schematic structure of an electronic device relating to a second embodiment as seen from a side of a top plate.

FIG. 6 shows an electronic device E7 that is provided with a top plate 31, a bottom plate 32, and a connector T7. Side plates 33A are respectively provided at front and back ends of the top plate 31. Side plates 34A are respectively provided at left and right ends of the bottom plate 32. The configuration between the top plate 31 and the bottom plate 32 may be the same as that shown in FIGS. 2 to 4.

The top plate 31 is formed with recesses 31C. The recesses 31C may be provided at an outer edge part of the top plate 31. Each of the recesses 31C is formed with a through hole 31D. A screw 36 is inserted through the through hole 31D into a screw hole of the bottom plate 32 to fix the top plate 31 to the bottom plate 32.

The top plate 31 is also formed with steps 31E. The steps 31E are respectively provided at both sides of the top plate 31 to extend from a front end part to a back end part of the top plate 31. Each of the steps 31E is formed with a first surface MB1 that extends from the front end part to the back end part of the top plate 31. A second surface MB2 is formed at a further interior side than the steps 31E to extend from the front end part to the back end part of the top plate 31. The second surface MB2 is positioned at an elevation that is lower than an elevation of the first surfaces MB1 as seen from the side of the top plate 31. Airflows AF3 can pass through over the second surface MB2 from the front end part to the back end part of the top plate 31.

The electronic device E7 has a height H1 that is determined by a vertical distance from a bottom surface of the bottom plate 32 to the first surface MB1 of the top plate 31. The height H1 of the electronic device E7 may conform to the SFF standard.

The second surface MB2 of the top plate 31 is positioned lower than the first surfaces MB1. This structure allows the airflows AF3 to pass through over the second surface MB2 of the top plate 31 without changing the height H1 of the electronic device E7. Thus, the heat dissipating characteristic of the electronic device E7 conforming to the SFF standard is improved.

Third Embodiment

Figure 7:
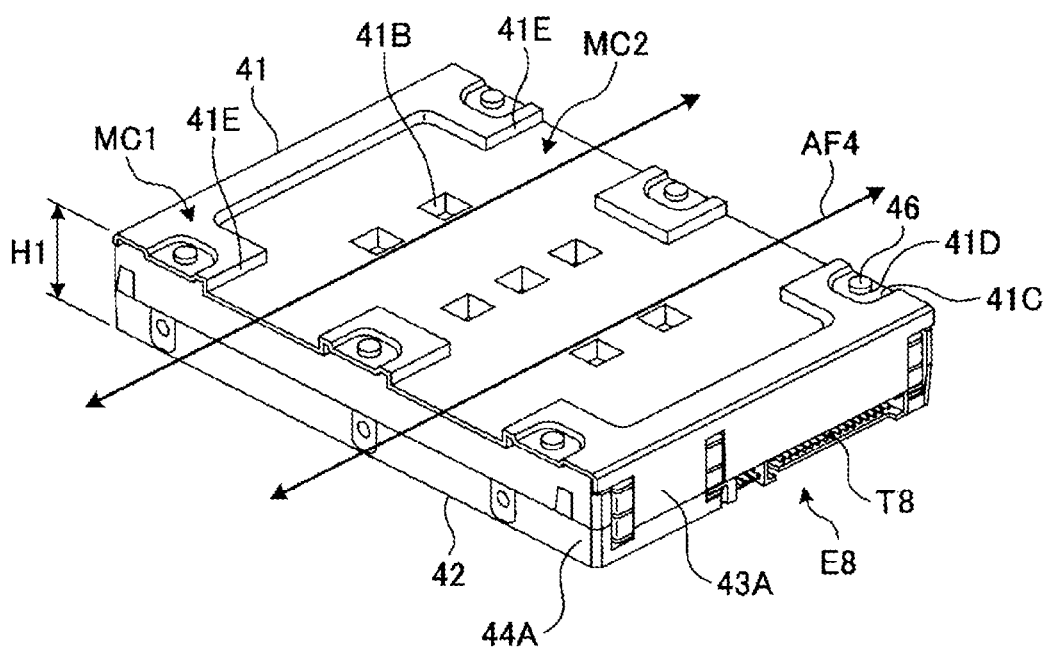
FIG. 7 is a perspective view showing a schematic structure of an electronic device relating to a third embodiment as seen from a side of a top plate.

FIG. 7 is a perspective view showing a schematic structure of an electronic device relating to a third embodiment as seen from a side of a top plate.

FIG. 7 shows an electronic device E8 that is provided with a top plate 41, a bottom plate 42, and a connector T8. Side plates 43A are respectively provided at front and back ends of the top plate 41. Side plates 44A are respectively provided at left and right ends of the bottom plate 42. The configuration between the top plate 41 and the bottom plate 42 may be the same as that shown in FIGS. 2 to 4.

The top plate 41 is provided with recesses 41B and 41C. The recesses 41B may be provided at an interior side of the top plate 41. The recesses 41B serve as paths for dissipating heat generated from the inside of the electronic device E8. The recesses 41C may be provided at an outer edge part of the top plate 41. Each of the recesses 41C is formed with a through hole 41D. A screw 46 is inserted through the through hole 41D into a screw hole of the bottom plate 42 to fix the top plate 41 to the bottom plate 42.

The top plate 41 is also formed with steps 41E. The steps 41E are respectively arranged at both sides of the top plate 41 to extend from a right end part to a left end part of the top plate 41. Each of the steps 41E is formed with a first surface MC1 that extends from the right end part to the left end part of the top plate 41. A second surface MC2 is formed at a further interior side than the steps 41E to extend from the right end part to the left end part of the top plate 41. The second surface MC2 is positioned at an elevation that is lower than an elevation of the first surfaces MC1 as seen from the side of the top plate 41. Airflows AF4 can pass through over the second surface MC2 from the right end part to the left end part of the top plate 41.

The electronic device E8 has a height H1 that is determined by a vertical distance from a bottom surface of the bottom plate 42 to the first surface MC1 of the top plate 41. The height H1 of the electronic device E8 may conform to the SFF standard.

The second surface MC2 of the top plate 41 is positioned lower than the first surfaces MC1. This structure allows the airflows AF4 to pass through over the second surface MC2 of the top plate 41 without changing the height H1 of the electronic device E8. Thus, the heat dissipating characteristic of the electronic device E8 conforming to the SFF standard is improved.

Fourth Embodiment

Figure 8:
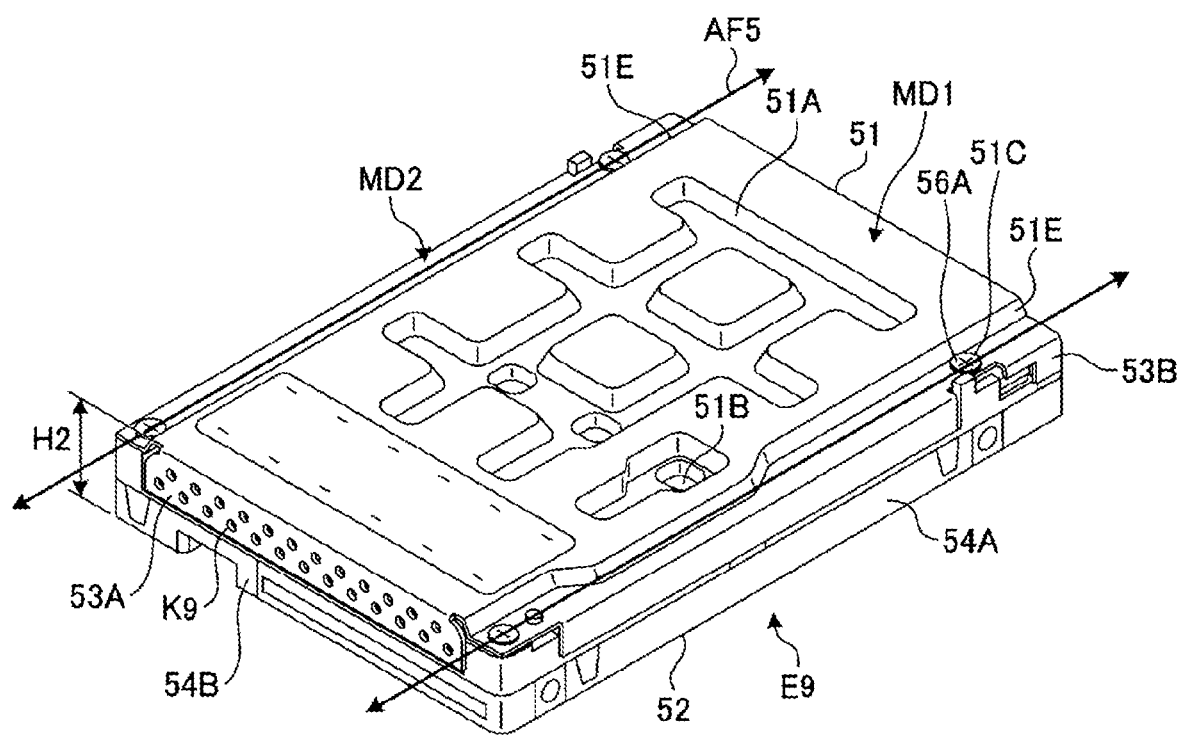
FIG. 8 is a perspective view showing a schematic structure of an electronic device relating to a fourth embodiment as seen from a side of a top plate.
Figure 9:
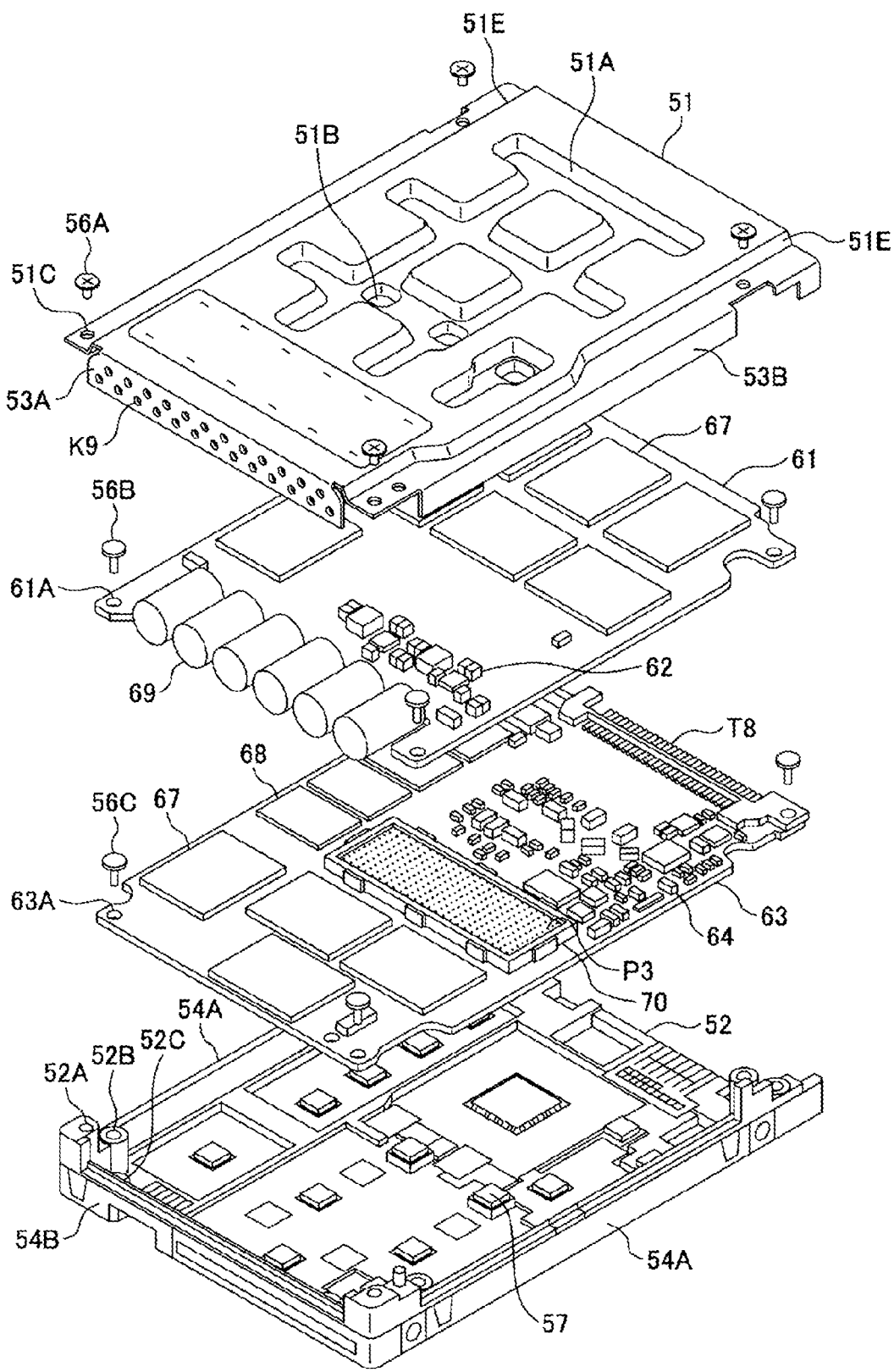
FIG. 9 is an exploded perspective view of the electronic device shown in FIG. 8.

FIG. 8 is a perspective view showing a schematic structure of an electronic device relating to a fourth embodiment as seen from a side of a top plate. FIG. 9 is an exploded perspective view of the electronic device shown in FIG. 8. This embodiment exemplifies an electronic device mounted with two circuit boards.

FIG. 8 shows an electronic device E9 that is provided with a top plate 51 and a bottom plate 52. As shown in FIG. 9, circuit boards 61 and 63 are placed between the top plate 51 and the bottom plate 52.

A side plate 53A is provided at a front end of the top plate 51, and side plates 53B are respectively provided at left and right ends of the top plate 51. The side plate 53A is provided with ventilating holes K9. Side plates 54A are respectively provided at left and right ends of the bottom plate 52, and a side plate 54B is provided at a front end of the bottom plate 52. The top plate 51, the bottom plate 52, the side plates 53A, 53B, 54A, and 54B may enclose the circuit boards 61 and 63.

The top plate 51 is formed with ribs 51A and recesses 51B. The ribs 51A increase the rigidity of the top plate 51. The ribs 51A may be formed so as to protrude from the top plate 51 toward the bottom plate 52. The recesses 51B serve as paths for dissipating heat generated from the circuit boards 61 and 63.

The top plate 51 is also formed with steps 51E. Each of the steps 51E is provided at an outer edge part of the top plate 51 to extend from a front end part to a back end part of the top plate 51. A first surface MD1 is formed at a further interior side than the steps 51E to extend from the front end part to the back end part of the top plate 51. Each of the steps 51E is formed with a second surface MD2 that extends from the front end part to the back end part of the top plate 51. The second surfaces MD2 are positioned at an elevation that is lower than an elevation of the first surface MD1 as seen from the side of the top plate 51. Airflows AF5 can pass through over the second surfaces MD2 from the front end part to the back end part of the top plate 51.

The top plate 51 is also formed with through holes 51C. The through holes 51C may be provided in the second surfaces MD2. A screw 56A is inserted through the through hole 51C into a screw hole of the bottom plate 52 to fix the top plate 51 to the bottom plate 52.

The electronic device E9 has a height H2 that is determined by a vertical distance from a bottom surface of the bottom plate 52 to the first surface MD1 of the top plate 51. The height H2 of the electronic device E9 may conform to the SFF standard. Arranging the through holes 51C in the second surfaces MD2 prevents the heads of the screws 56A, which are inserted through the through holes 51C into the corresponding screw holes of the bottom plate 52, from projecting higher than the first surface MD1. This structure provides an electronic device E8 with a height H2 conforming to the SFF standard.

The second surfaces MD2 of the top plate 51 are positioned lower than the first surface MD1. This structure allows the airflows AF5 to pass through over the second surfaces MD2 of the top plate 51 without changing the height H2 of the electronic device E9. Thus, the heat dissipating characteristic of the electronic device E9 conforming to the SFF standard is improved.

As shown in FIG. 9, the bottom plate 52 is formed with screw holes 52A to 52C. The screw holes 52A to 52C may be provided at the four corners of the bottom plate 52. A top surface of the screw hole 52A may be formed higher than a top surface of the screw hole 52B, and a top surface of the screw hole 52B may be formed higher than a top surface of the screw hole 52C. The screw hole 52A is made to receive the screw 56A. The screw hole 52B is made to receive a screw 56B. The screw hole 52C is made to receive a screw 56C.

The circuit boards 61 and 63 are mounted with NAND packages 67. The NAND packages 67 may be mounted on both sides of the respective circuit boards 61 and 63.

Electronic components 62 and capacitors 69 are mounted on a surface of the circuit board 61. DRAM packages 68, electronic components 64, and a connector 70 are mounted on a surface of the circuit board 63. The electronic components 62 and 64 may constitute a power source circuit and other circuits. A controller package is mounted on a back surface of the circuit board 63. A connector T9 is mounted on an end of the circuit board 63. The connector 70 is formed with pin holes P3.

The circuit boards 61 and 63 are respectively formed with through holes 61A and 63A. Each of the through holes 61A is made to receive a screw 56B. Each of the through holes 63A is made to receive a screw 56C. The through holes 61A and 63A may be provided at the four corners of the respective circuit boards 61 and 63.

Pins of a connector at a back surface of the circuit board 61 are inserted into the pin holes P3 of the connector 70 of the circuit board 63. The screw 56C is inserted through the through hole 63A into the screw hole 52C to fix the circuit board 63 to the bottom plate 52. The screw 56B is inserted through the through hole 61A into the screw hole 52B to fix the circuit board 61 to the bottom plate 52. The screw 56A is inserted through the through hole 51C into the screw hole 52A to fix the top plate 51 to the bottom plate 52.

The top surface of the screw hole 52A may be made higher than the top surface of the screw hole 52B, and the top surface of the screw hole 52B may be made higher than the top surface of the screw hole 52C. This structure enables maintaining a constant distance between the bottom plate 52 and the circuit board 63, between the circuit boards 61 and 63, and between the circuit board 61 and the top plate 51 without providing the frame members 12 and 14 shown in FIG. 3. Heat dissipating sheets 57 may be placed between the circuit board 63 and the bottom plate 52. Heat dissipating sheets may also be placed between the circuit board 61 and the top plate 51.

As shown in FIG. 8, the second surfaces MD2 of the top plate 51 are positioned lower than the first surface MD1. This structure allows the airflows AF5 to pass through over the second surfaces MD2 of the top plate 51 without changing the height H2 of the electronic device E9. Thus, the heat dissipating characteristic of the electronic device E9 conforming to the SFF standard is improved, and therefore, the reliability of the electronic device E9 is improved as well as equipment for assembling the electronic device E9 and a package of the electronic device E9 are made common with other devices that conform to the SFF standard.

Fifth Embodiment

Figure 10:
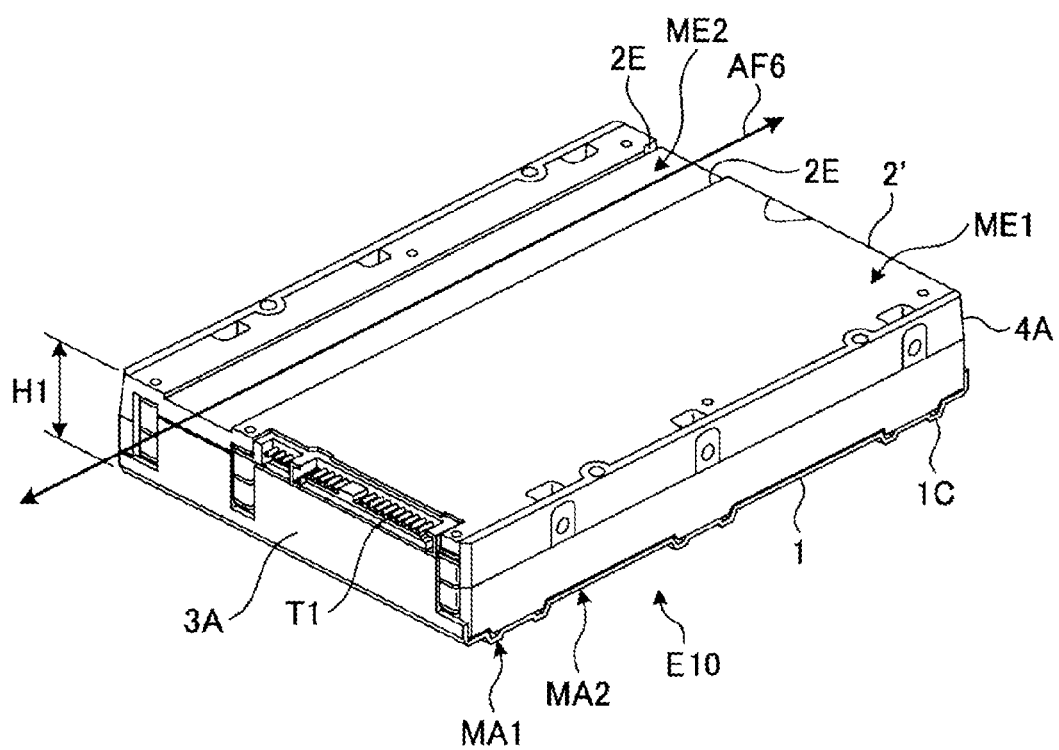
FIG. 10 is a perspective view showing a schematic structure of an electronic device relating to a fifth embodiment as seen from a side of a bottom plate.

FIG. 10 is a perspective view showing a schematic structure of an electronic device relating to a fifth embodiment as seen from a side of a bottom plate.

FIG. 10 shows an electronic device E10 that is provided with a bottom plate 2' instead of the bottom plate 2 of the electronic device E1 shown in FIGS. 1A and 1B. The configuration except for the bottom plate 2' of the electronic device E10 may be the same as that of the electronic device E1 shown in FIGS. 1A and 1B.

The bottom plate 2' is formed with a step 2E. The step 2E extends from a front end part to a back end part of the bottom plate 2'. A first surface ME1 is provided at an outer side of the step 2E to extend from a front end part to a back end part of the bottom plate 2'. A second surface ME2 is provided at an inner side of the step 2E to extend from the front end part to the back end part of the bottom plate 2'. The second surface ME2 is provided so as not to cross the connector T1. The second surface ME2 is positioned at an elevation that is lower than an elevation of the first surface ME1 as seen from the side of the bottom plate 2'. An airflow AF6 can pass through over the second surface ME2 from the front end part to the back end part of the bottom plate 2'.

The electronic device E10 has a height H1 that is determined by a vertical distance from the first surface ME1 of the bottom plate 2' to the first surface MA1 of the top plate 1. The height H1 of the electronic device E10 may conform to the SFF standard.

The second surface ME2 of the bottom plate 2' is positioned lower than the first surface ME1. This structure allows the airflow AF6 to pass through over the second surface ME2 of the bottom plate 2' without changing the height H1 of the electronic device E10. Thus, the heat dissipating characteristic of the electronic device E10 conforming to the SFF standard is improved. Arranging the second surface ME2 at a position not crossing the connector T1 eliminates the need for changing the position of the connector T1, thereby providing the electronic device E10 conforming to the SFF standard.

Although the SSD is exemplified as the electronic device in each of the above embodiments, any electronic device may be used. For example, the electronic device may be a hard disk drive (HDD), a computer, or a communication device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device, comprising:
   a top plate having a first portion with a first upper surface that is formed along outer edges of the top plate, and a second portion with a second upper surface that is positioned at an elevation that is lower than an elevation of the first upper surface, the top plate having first and second outer edges opposite to each other and third and fourth outer edges opposite to each other, the first upper surface being along the third and fourth outer edges, the second upper surface extending from the first outer edge to the second outer edge and from the first upper surface along the third outer edge to the first outer surface along the fourth outer edge;
   a bottom plate provided under the top plate; and
   a circuit board disposed between the top plate and the bottom plate and mounted with an electronic component.

2. The electronic device according to claim 1, wherein the first upper surface is formed on a plurality of protrusions that extends from the second surface.

3. The electronic device according to claim 2, wherein the protrusions include a first plurality of protrusions formed along the third outer edge and a second plurality of protrusions formed along the fourth outer edge.

4. The electronic device according to claim 3, wherein the second upper surface extends to the third outer edge at portions of the top plate between the first plurality of protrusions and to the fourth outer edge at portions of the top plate between the second plurality of protrusions.

5. The electronic device according to claim 2, wherein the protrusions include a plurality of recessed portions, and the each of the recessed portions has a screw hole formed therethrough.

6. The electronic device according to claim 1, wherein the bottom plate includes a first portion with a first lower surface and a second portion with a second lower surface that is positioned at an elevation that is higher than an elevation of the first lower surface, the second lower surface extending from a first end part of the bottom plate to a second end part of the bottom plate.

7. The electronic device according to claim 6, wherein a height from the first lower plate to the first upper surface conforms to Small Form Factor (SFF) standard.

8. The electronic device according to claim 1, wherein long edges of the second upper surface are formed along a flow path of a fluid flowing on the surface of the electronic device.

9. The electronic device according to claim 8, wherein the fluid flows from the first edge to the second edge.

10. The electronic device according to claim 8, wherein the fluid is airflows.

11. The electronic device according to claim 1, wherein no region of the top plate between the first upper surface along the third outer edge and the first upper surface along the fourth outer edge has an elevation that is the same as the elevation of the first upper surface.

* * * * *